United States Patent
Kaldenberg

[11] Patent Number: 5,897,338
[45] Date of Patent: Apr. 27, 1999

[54] METHOD FOR ENCAPSULATING AN INTEGRATED SEMI-CONDUCTOR CIRCUIT

[75] Inventor: Peter Jacobus Kaldenberg, Nijmegen, Netherlands

[73] Assignee: European Semiconductor Assembly (Eurasem) B.V., Nijmegen, Netherlands

[21] Appl. No.: 08/871,960

[22] Filed: Jun. 10, 1997

[30] Foreign Application Priority Data

Jun. 11, 1996 [NL] Netherlands ............................ 1003315

[51] Int. Cl.⁶ .................................................... H01L 21/00
[52] U.S. Cl. ........................... 438/116; 438/123; 438/127; 216/33
[58] Field of Search ..................................... 438/116, 118, 438/123, 126, 127; 257/787; 216/33

[56] References Cited

U.S. PATENT DOCUMENTS

| | | |
|---|---|---|
| 4,894,707 | 1/1990 | Yamawaki et al. . |
| 5,483,740 | 1/1996 | Maslakow .............................. 216/14 X |

FOREIGN PATENT DOCUMENTS

| | | |
|---|---|---|
| 4 424 541 | 8/1995 | Germany . |
| 55-138845 | 10/1980 | Japan . |
| 60-113950 | 6/1985 | Japan . |
| 2-067750 | 3/1990 | Japan . |

*Primary Examiner*—William Powell
*Attorney, Agent, or Firm*—Young & Thompson

[57] ABSTRACT

Method for encapsulating an integrated semi-conductor circuit (die) comprising the following steps:

a) mounting the semi-conductor circuit onto the surface of a so-called lead frame, b) attaching connecting wires between the contact surfaces of the semi-conductor circuit and selected parts of the lead frame (bonding operation), c) by means of a mould producing a plastic housing which at least encapsulates the semi-conductor circuit, the supporting surface, the bonding wires and part of the lead frame, d) the mould comprises an inwards extending section of which the end surface in the closed situation of the mould extends parallel to the free upper side of the integrated semi-conductor circuit at short distance thereof, and e) before closing the mould a layer of heat resistant deformable material in the form of a ring or a continuous layer is brought in between the upper side of the integrated semi-conductor circuit and said end surface of the inwards extending part, which layer not or hardly adheres to the plastic housing.

7 Claims, 1 Drawing Sheet

METHOD FOR ENCAPSULATING AN INTEGRATED SEMI-CONDUCTOR CIRCUIT

BACKGROUND OF THE INVENTION

The invention relates to a method for encapsulating an integrated semi-conductor circuit (die) comprising the following steps:

a) mounting the semi-conductor circuit onto the surface of a so-called lead frame, b) attaching connecting wires between the contact surfaces of the semi-conductor circuit and selected parts of the lead frame (bonding operation), c) by means of a mould producing a plastic housing which at least encapsulates the semi-conductor circuit, the support surface, the bonding wires and part of the lead frame.

Such a method is generally known and is applied on a wide scale for encapsulating integrated semi-conductor circuits. In general the created housing will encapsulate the semi-conductor circuit completely such that only the connecting pins, forming part of the so-called lead frame, are extending outside the housing whereby the semi-conductor circuit as such is therefore screened from outer influences as much as possible.

In contrast therewith the invention is especially directed to a method for obtaining an encapsulation around an integrated semi-conductor circuit which comprises opto-electronic components whereby the housing should have a cavity which gives an open connection between the outside world and the active area on the 'die'. If this cavity should be closed, it should be closed with window, opaque for radiation. Within the meaning of the invention radiation is both radiation in the visible part of the spectrum as well as radiation infrared or ultraviolet part of the spectrum.

The U.S. Pat. No. 5,200,367 comprises on the one hand a description of so-called ceramic housings and comprises on the other a description of a plastic housing which could be used as a replacement for the ceramic housing. In both cases however the housing is embodied such that the integrated circuit at the side, where the radiation should impinge on the circuit, is open. This open section can be covered by a separate plate of glass or, in case the semi-conductor circuit does not comprise any light sensitive components, be covered by a plate of another material such as a metal plate.

It is known for the expert in this field that the use of ceramic housings will lead to increase of costs of the final electronic component. Ceramic housings are therefore almost exclusively used for components which have to fulfil high requirements.

The steps, which successively have to be carried out according to the method described in U.S. Pat. No. 5,200,367 to obtain the desired end result are in their sequence clearly different from the generally used sequence. As is indicated shortly in the first paragraph, it is known to install first of all the chip or die on a lead frame and to attach the bonding wires between the chip or die and selected parts of the lead frame. Thereafter this intermediate product is encapsulated using a mould. This last step does not have to be carried out in a direct sequence with the earlier steps and can be performed at another location.

According to U.S. Pat. No. 5,200,367 first of all the lead frame is positioned within the mould and a housing is formed which is open at the upper side. Thereafter, the chip is installed on the related not covered section of the lead frame followed by bonding the connecting wires between the chip and selected sections of the lead frame (which for that purpose are not encapsulated in the housing). Both mentioned processes have to be carried out in a cavity in the already made housing. Because of that the number of possibilities to attach the chip to the lead frame is restricted. Welding at higher temperatures for instance will certainly lead to housing damage. Also the presence of the housing as such may for a hindrance for applying the usual bonding machines for attaching the bonding wires.

SUMMARY OF THE INVENTION

The purpose of the invention is now to indicate in which way an integrated semi-conductor can be brought into a plastic housing comprising a cavity using as much as possible method steps in the usual order.

In agreement with the object of the method according to the invention is now characterized in that:

d) the mould comprises an inwards extending section of which the end surface in the closed situation of the mould extends parallel to the free upper side of the integrated semi-conductor circuit at short distance thereof, and e) before closing the mould a layer or ring of heat resistant deformable material is brought in between the upper side of the integrated semi-conductor circuit and the end surface of the inwards extending part, which layer not or hardly adheres to the plastic housing.

BRIEF DESCRIPTION OF THE DRAWINGS

The invention will be explained in more detail with reference to the attached drawings.

DETAILED DESCRIPTION OF THE EMBODIMENTS

During the manufacturing of integrated semi-conductor circuits in general a large number of these circuits are made simultaneously onto one single large silicon platelet, a so-called wafer. After completing the actual integration process the wafer is divided into the separated semi-conductor circuits or chips using known techniques, for instance by cutting or etching. (In English literature these chip are also called "die" or "pellet"). Thereafter, each chip is positioned on a metal framework comprising contact pins which are mutually connected through connecting parts such, that as a whole they form a so-called lead frame. The central section of such a lead frame comprises a mounting surface onto which the chip can be positioned and attached by means of soldering or another method which is known as such. After fixing the chip in this manner onto the central section of the lead frame the bonding wires are attached between the various contact pins and the connecting surfaces or "pellets" on the chip. The result at the end of this operation is schematically shown in cross-section in FIG. 1.

Figure 1:
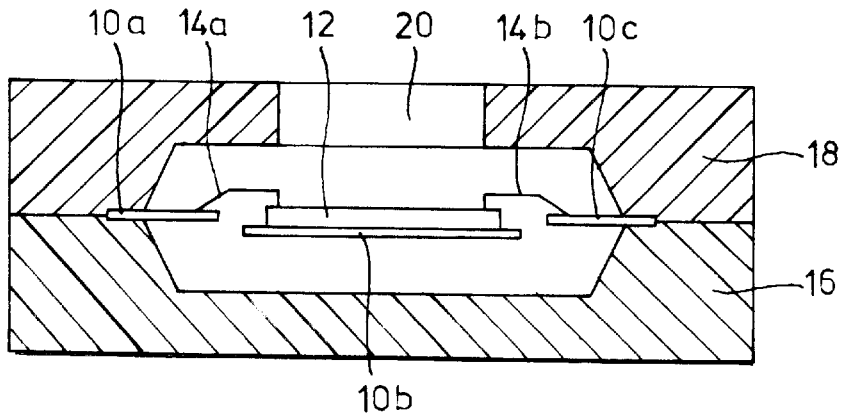
FIG. 1 illustrates a cross-section through a mould with therein the semi-conductor circuit, the lead frame and the connecting wires between the circuit and the frame.

In FIG. 1 the contact pins are indicated by 10a and 10c, whereas the central mounting surface of the lead frame is indicated by 10b. Onto this mounting surface 10b (in the English language called a die pad) the chip 12 is fixed in a known manner, which does not play a role within the scope of the invention. Furthermore, between the connecting pins 10a and 10c on the one hand and the chip 12 on the other hand bonding wires 14a and 14b are attached. All the used techniques therefore are known as such as do not require further explanation.

In the illustrated embodiment the mould comprises two parts, i.e. a bottom part 16 and a cover part 18. In contrast with the usually completely closed moulds an opening 20 is made in the cover part 18 above the semi-conductor circuit 12.

Figure 2:
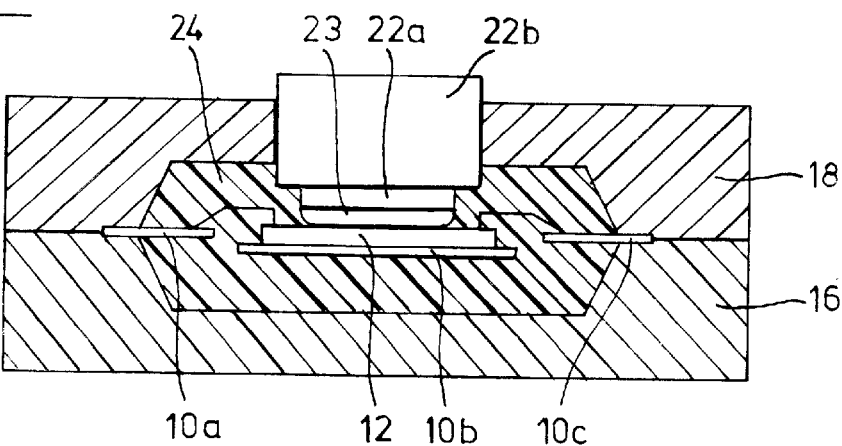
FIG. 2 illustrates a cross-section through the mould after the opening at the upper side is closed by an inwards extending component, fluid material is applied in the form of a layer or ring between the component and the semi-conductor circuit and the plastic, which forms the encapsulation, is injected.

A further intermediate step in the method is illustrated in FIG. 2. The opening 20 is closed by means of inwards extending part 22 of which the cross-sectional shape corresponds with the shape of the opening 20. In the illustrated embodiment this part comprises a central column 22a and a ring 22b, fitting about the column. The column 22a extends further inside than the ring 22b for reasons which will be made clear hereinafter.

Preceding the insertion of the part 22 the under side thereof, especially the under surface of column 22a, is applied with a certain amount of heat resistant deformable material 23 in the form of a ring or a continuous layer, the material being of a type which not or hardly adheres to the plastic which hereafter will form the housing. The amount of this material is selected such that after locating the part 22 a section of the semi-conductor circuit surface is covered or enclosed by this material as is illustrated in FIG. 2. Of course, as an alternative the deformable material can be applied to the surface of the semi-conductor circuit whereafter the part 22 is brought in position. However, the first method is preferred because of the very simple correct positioning of the material.

Preferably the deformable material consists of a gel, especially a silicon gel. This material does not or hardly adhere to the various types of epoxy which in general are used for making the actual encapsulation.

Thereafter the epoxy or resin is injected in the free space in the mould to create the encapsulation. The resin is indicated by 24 in FIG. 2.

Figure 3:
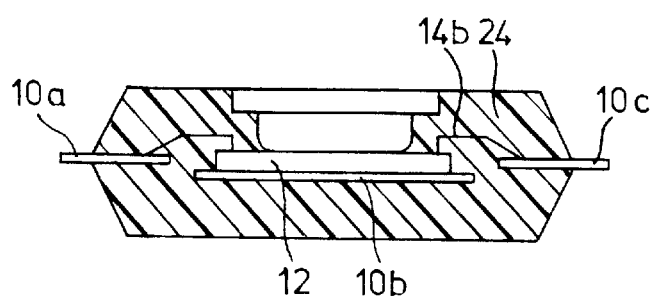
FIG. 3 illustrates a cross-section through the housing after removing the housing from the mould.
Figure 4:
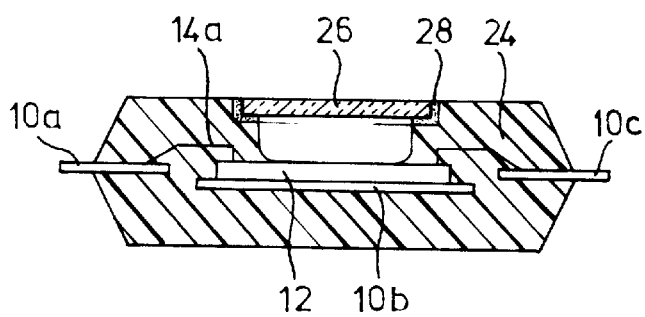
FIG. 4 illustrates a cross-section through the housing after positioning a closing window.

After at least partly hardening of the now encapsulated semi-conductor circuit, removing it out of the mould and removing the deformable material 23 the intermediate product will be obtained which is shown in cross-section in FIG. 3. The semi-conductor circuit is partly encapsulated and a part of the upper surface of the semi-conductor circuit is still left free. The opening above this section has a stepwise shape as is clearly visible in FIG. 3. This shape, resulting from the use of a column 22a and a separate tube 22b is suitable for mounting a window 26 in the way as illustrated in FIG. 4. This window can be attached for instance by using a suitable adhesive 28.

It will be clear that the presented method can be applied to make core cavities above one semi-conductor circuit. In that case the mould should comprise a corresponding number of openings, each of which has to be closed by an inwards extending element, such as the combination of a column 22a and the tube 22b.

Furthermore, it will be clear that instead of this combination one single component of adapted shape can be applied.

Also it will be clear that the position of the open cavity can be varied based on the location of the active area on the 'die'. In that case the mould should comprise a corresponding opening 20 the position of which has to be closed by an inwards extending element.

I claim:

1. A method for encapsulating an integrated semi-conductor circuit (die) comprising the following steps:

a) mounting the semi-conductor circuit onto the surface of a lead frame, b) attaching connecting wires between the contact surfaces of the semi-conductor circuit and selected parts of the lead frame (bonding operation), c) by means of a mould producing a plastic housing which at least encapsulates the semi-conductor circuit, the supporting surface, the bonding wires and part of the lead frame, wherein d) the mould comprises an inwards extending section of which the end surface in the closed situation of the mould extends parallel to the free upper side of the integrated semi-conductor circuit at short distance thereof, and e) before closing the mould a layer of heat resistant deformable material in the form of a ring or a continuous layer is brought in between the upper side of the integrated semi-conductor circuit and said end surface of the inwards extending part, which layer not or hardly adheres to the plastic housing.

2. A method according to claim 1, wherein the material is applied to end surface of the inwards extending part such that the end surface is covered or enclosed by said material.

3. A method according to claim 1, wherein said material consists of a silicon gel.

4. A mould for applying a method according to claim 1, comprising two or more detachable components together defining a space corresponding to the desired outer shape of the plastic housing, wherein said inwards extending part consists of a separate columnar component which, preceding the use of the mould, is attached in a thereto destined opening in the wall of one of the other components.

5. A mould according to claim 4, wherein the inwards extending part of the separate columnar component comprises said end surface as well as a columnar wall perpendicular thereto.

6. A mould according to claim 5, wherein there is a stepwise transition between the columnar wall and the end surface such that the columnar wall connects to a ring-shaped surface at a distance of said end surface whereby a further columnar wall having a smaller cross-section than the cross-section of the first mentioned columnar wall is present between said ring-shaped surface and the end surface.

7. A mould according to claim 6, wherein the stepwise transition is realized by making the component out of two parts, i.e. a columnar-shaped part determining the end surface and a tube, fitting around said columnar-shaped part and determining the ring-shaped surface.

* * * * *